United States Patent
Loubet et al.

(10) Patent No.: US 10,304,936 B2
(45) Date of Patent: May 28, 2019

(54) PROTECTION OF HIGH-K DIELECTRIC DURING RELIABILITY ANNEAL ON NANOSHEET STRUCTURES

(71) Applicant: International Business Machines Corporation, Armonk, NY (US)

(72) Inventors: Nicolas J. Loubet, Guilderland, NY (US); Sanjay C. Mehta, Niskayuna, NY (US); Vijay Narayanan, New York, NY (US); Muthumanickam Sankarapandian, Niskayuna, NY (US)

(73) Assignee: INTERNATIONAL BUSINESS MACHINES CORPORATION, Armink, NY (US)

( * ) Notice: Subject to any disclaimer, the term of this patent is extended or adjusted under 35 U.S.C. 154(b) by 168 days.

(21) Appl. No.: 15/146,325

(22) Filed: May 4, 2016

(65) Prior Publication Data

US 2017/0323949 A1 Nov. 9, 2017

(51) Int. Cl.
| | | |
|---|---|---|
| *H01L 21/00* | (2006.01) | |
| *H01L 29/423* | (2006.01) | |
| *H01L 29/06* | (2006.01) | |
| *H01L 29/786* | (2006.01) | |
| *H01L 29/49* | (2006.01) | |
| *H01L 29/51* | (2006.01) | |
| *H01L 29/66* | (2006.01) | |
| *H01L 21/28* | (2006.01) | |

(52) U.S. Cl.
CPC .. *H01L 29/42392* (2013.01); *H01L 21/28088* (2013.01); *H01L 21/28176* (2013.01); *H01L 29/0673* (2013.01); *H01L 29/4966* (2013.01); *H01L 29/518* (2013.01); *H01L 29/66772* (2013.01); *H01L 29/78654* (2013.01); *H01L 29/78696* (2013.01)

(58) Field of Classification Search
CPC ......... H01L 29/42392; H01L 21/28088; H01L 21/28176; H01L 29/4966; H01L 29/518; H01L 29/66772; H01L 29/78654; H01L 29/78696
See application file for complete search history.

(56) References Cited

U.S. PATENT DOCUMENTS

| | | | |
|---|---|---|---|
| 6,407,435 B1 | 6/2002 | Ma et al. | |
| 6,818,517 B1 | 11/2004 | Maes | |
| 7,897,450 B2 | 3/2011 | Koehler et al. | |
| 9,105,497 B2 | 8/2015 | Hong et al. | |
| 9,165,928 B2 | 10/2015 | Xie et al. | |
| 9,673,279 B2 * | 6/2017 | Lee | ..................... H01L 29/1033 |
| 9,748,352 B2 * | 8/2017 | Liu | ................... H01L 29/42392 |
| 9,876,083 B2 * | 1/2018 | Chi | ....................... H01L 29/408 |

(Continued)

*Primary Examiner* — Mounir S Amer
*Assistant Examiner* — Alexander Belousov
(74) *Attorney, Agent, or Firm* — Cantor Colburn LLP; Vazken Alexanian

(57) ABSTRACT

A starting structure for forming a gate-all-around field effect transistor (FET) and a method of fabricating the gate-all-around FET. The method includes forming a stack of silicon nanosheets above a substrateforming an interfacial layer over the nanosheets depositing a high-k dielectric layer conformally on the interfacial layer. The method also includes depositing a layer of silicon nitride (SiN) above the high-k dielectric layer and performing reliability anneal after depositing the layer of SiN to crystallize the high-k dielectric layer.

12 Claims, 9 Drawing Sheets

(56) References Cited

U.S. PATENT DOCUMENTS

2015/0311206 A1 10/2015 Hong et al.
2015/0348970 A1 12/2015 Xie et al.
2018/0151578 A1* 5/2018 Avci .................. H01L 27/11521

* cited by examiner

PROTECTION OF HIGH-K DIELECTRIC DURING RELIABILITY ANNEAL ON NANOSHEET STRUCTURES

BACKGROUND

The present invention relates to a process in the formation of a gate-all-around transistor, and more specifically, to protection of a high-K dielectric during reliability anneal on nanosheet structures.

In the evolution of transistor design, the fin field effect transistor (finFET) is a successor of a planar transistor. In finFETs, the transistor channel is formed as a vertical fin with the gate wrapped over the fin between the source and drain regions such that the gate is on three sides of the channel. In comparison with the planar transistor, the finFET provides improved performance for scaled gate lengths. As fin widths decrease and approach 5 nanometers, however, channel width variations may cause variability and mobility loss in finFETs. A gate-all-around FET addresses this variability by placing the gate on all four sides of the channel. A gate-all-around nanowire, for example, is essentially a silicon nanowire with a gate going around the circumference. A gate-all-around nanosheet is a three-dimensional silicon nanosheet with a gate going around all four sides as well as the surface perpendicular to all four sides. The formation of a replacement gate-all-around nanosheet transistor, like the formation of a replacement gate finFET, generally involves the formation of a dummy gate used for source and drain formation followed by removal of the dummy gate and replacement with a metal gate.

SUMMARY

According to an embodiment of the present invention, a method of fabricating a gate-all-around field effect transistor (FET) includes forming a stack of silicon nanosheets above a substrate, the nanosheets formed as three-dimensional structures with empty spaces around each of the nanosheets. Forming an interfacial layer over the nanosheets includes covering four sides that form a perimeter of a cross-section of the three-dimensional structure of each of the nanosheets. Depositing a high-k dielectric layer is done conformally on the interfacial layer. The method also includes depositing a layer of silicon nitride (SiN) above the high-k dielectric layer, and performing reliability anneal after the depositing the layer of SiN to crystallize the high-k dielectric layer.

According to another embodiment, a starting structure for performing reliability anneal on a high-k dielectric layer during the formation of a gate-all-around field effect transistor (FET) includes a stack of nanosheets formed above a substrate, the nanosheets being comprised of silicon and being formed as three-dimensional structures with empty spaces around each of the nanosheets. An interfacial layer is formed over the nanosheets, the interfacial layer covering four sides that form a perimeter of a cross-section of the three-dimensional structure of each of the nanosheets, and a high-k dielectric layer is conformally formed on the interfacial layer; and a silicon nitride (SiN) layer formed above the high-k dielectric layer.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
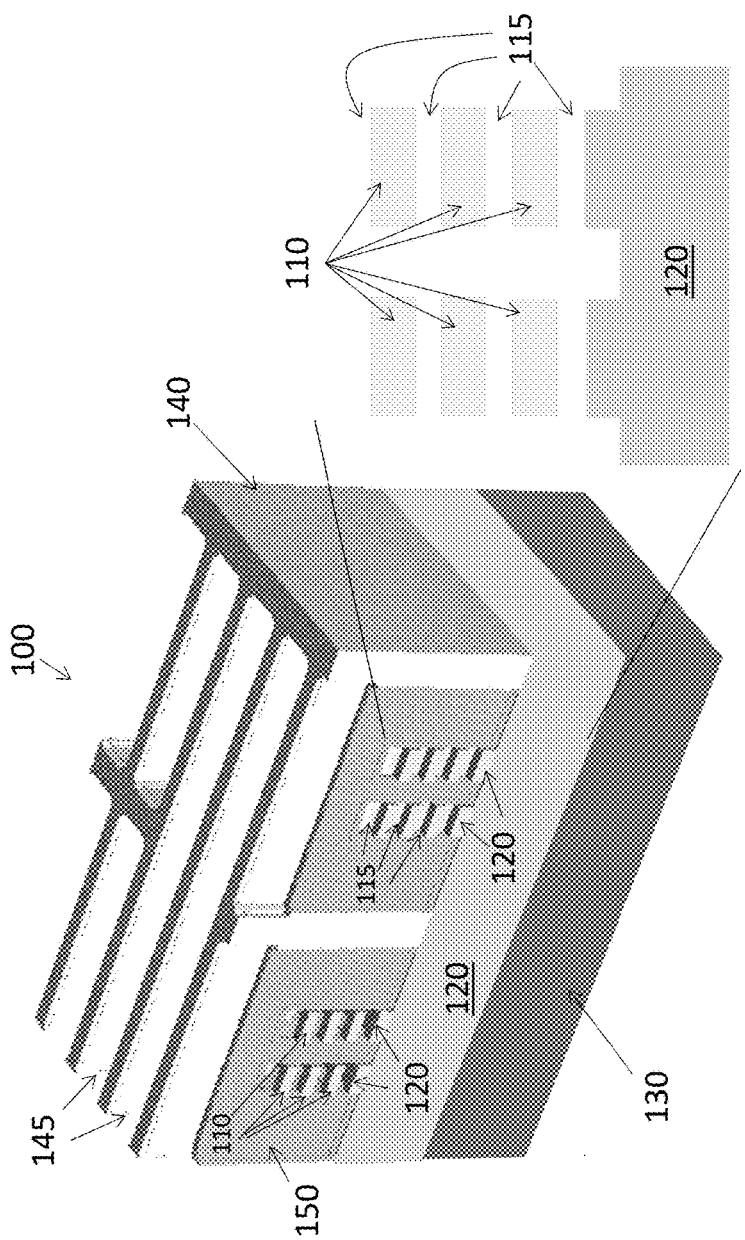
FIG. 1 shows an intermediate structure in the fabrication of a gate-all-around field effect transistor that undergoes the reliability anneal process according to embodiments of the invention.

Various embodiments of the present disclosure are described herein with reference to the related drawings. Alternative embodiments may be devised without departing from the scope of this disclosure. It is noted that various connections and positional relationships (e.g., over, below, adjacent, etc.) are set forth between elements in the following description and in the drawings. These connections and/or positional relationships, unless specified otherwise, may be direct or indirect, and the present disclosure is not intended to be limiting in this respect. Accordingly, a coupling of entities may refer to either a direct or an indirect coupling, and a positional relationship between entities may be a direct or indirect positional relationship. As an example of an indirect positional relationship, references in the present disclosure to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

For the sake of brevity, conventional techniques related to the fabrication of a gate-last transistor may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

As previously noted herein, a gate-all-around FET with nanosheets address potential issues associated with decreasing the size of integrated circuits that include finFETs. Specifically, as the density of the arrangement of FET devices is increased based on using multiple vertical fins as conducting channel regions, the lateral spacing between adjacent vertical fins may become too small to enable proper operation. Stacked nanosheet FETs may include multiple nanosheets arranged in a three-dimensional array with a gate stack formed on a channel region of the nanosheets. In the gate-all-around design, the gate stack surrounds all four sides of the channel region of a protruding nanosheet. The replacement gate technique of fabricating a FET involves well-known processes including forming a dummy polysilicon gate which can withstand the processing of the source and drain regions. After the source and drain regions are formed, the polysilicon gate is removed in a process referred to as dummy gate removal.

Before the metal replacement gate is formed, one fabrication process that is performed is referred to as a reliability anneal. An interfacial layer (IL) (e.g., silicon dioxide ($SiO_2$)) and a high-k dielectric are conformally deposited around the channel material. This high-k dielectric functions as a gate insulation layer so that a work function metal may be deposited above and, in the case of the gate-all-around arrangement, also all around the channel. Before the work function metal is deposited, an anneal process is performed to improve positive bias temperature instability (PBTI) and negative bias temperature instability (NBTI) reliability of the high-k dielectric. This anneal process is referred to as the reliability anneal. During the reliability anneal, the high-k dielectric must be protected to ensure that oxygen does not reach the IL below, because oxygen will oxidize the channel silicon (Si) below the IL and form $SiO_2$, making the IL layer thicker.

A known approach to protecting the high-k dielectric during the reliability anneal is by using amorphous silicon (a-Si) as an oxygen barrier. While deposition of a-Si is a viable solution in finFET fabrication, for example, a-Si has not proven to be an effective oxygen barrier during the fabrication of gate-all-around nanosheets. This is because the geometry of the nanosheets is such that the void or empty space between adjacent nanosheets may be less than 3 nanometers. The a-Si, which is deposited by a chemical vapor deposition (CVD) process, cannot be conformally deposited in such narrow spaces.

Turning now to an overview of the present disclosure, one or more embodiments provide processing methodologies and resulting structures for performing reliability anneal on nanosheets while providing an oxygen barrier above the high-k dielectric layer. More specifically, one or more embodiments of the structures and methods detailed herein include deposition of silicon nitride (SiN) as an oxygen barrier prior to the reliability anneal process. According to one or more embodiments, titanium nitride (TiN) is deposited prior to deposition of the SiN. The SiN may be deposited by atomic layer deposition (ALD).

Turning now to a more detailed description of one or more embodiments, FIG. 1 shows an intermediate structure 100 in the fabrication of a gate-all-around FET that undergoes the reliability anneal process according to embodiments of the invention. The exemplary intermediate structure 100 that is shown has undergone the dummy gate formation, source and drain formation, and dummy gate removal and will ultimately form a multi-gate gate-all-around FET based on the processes detailed herein and additional processes that are well-known. The exemplary intermediate structure 100 includes stacks of three Si nanosheets 110 each that are formed within empty spaces 115 above an oxide layer 120. The oxide layer 120 is above a substrate 130 (e.g., Si). The oxide layer 120 is optional. Thus, in alternate embodiments, the nanosheets 110 may be formed directly on the bulk substrate 130. A cross-sectional view of the nanosheets 110 formed above the oxide layer 120 is also shown in FIG. 1. A spacer material 150 (e.g., SiN) surrounds the nanosheets 110 above the oxide layer 120. An oxide 140 resulting from the poly silicon removal includes gaps or empty spaces 145 in which replacement metal gates are subsequently formed. Because the nanosheets 110 protrude as shown in FIG. 1, all four sides (i.e., the perimeter of the rectangular cross-sectional shapes shown for the nanosheets 110) must be protected during the reliability anneal. As noted above, the empty spaces 115 between adjacent nanosheets 110 and between a nanosheet 110 and the oxide layer 120 may be as narrow as 3 nanometers. Thus, as detailed below, SiN deposited by ALD is used as an oxygen barrier.

Figure 2:
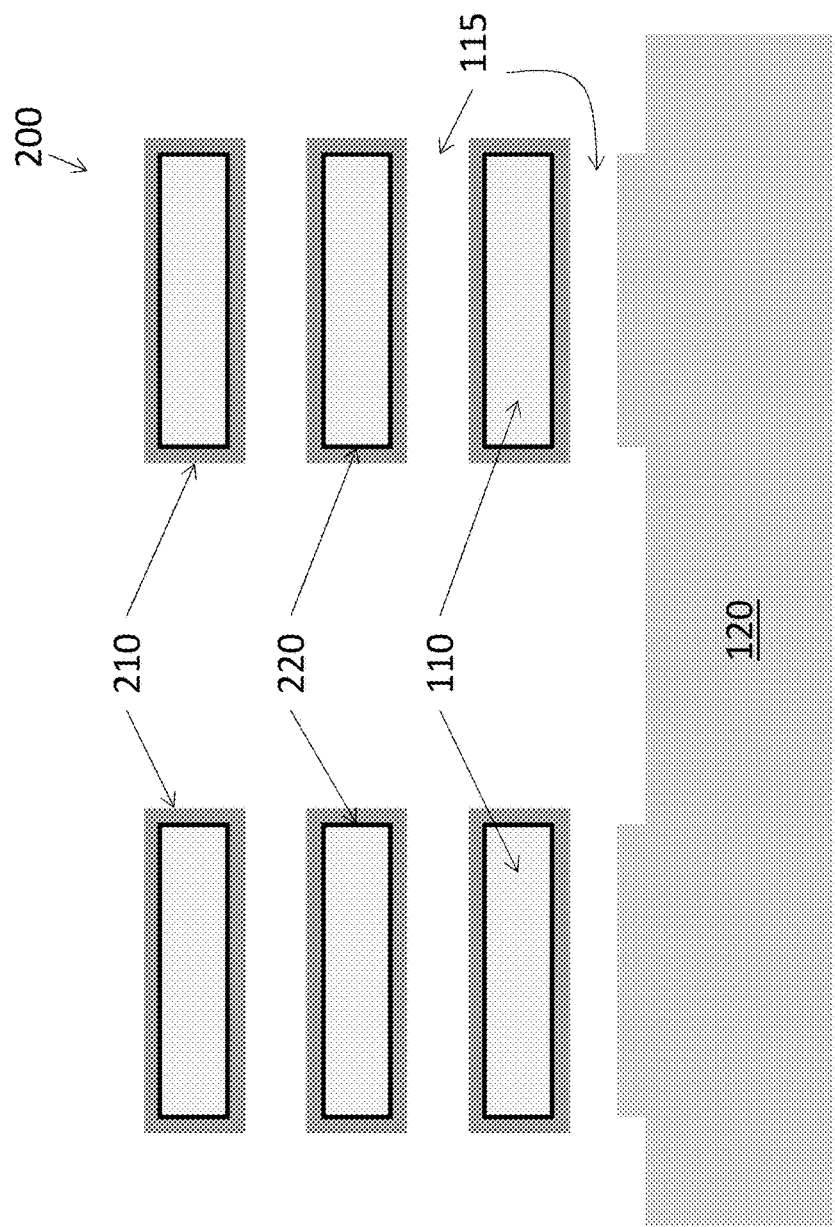
FIG. 2 shows a cross-sectional view of an intermediate structure with the high-k dielectric that undergoes the reliability anneal according to embodiments.

FIG. 2 shows a cross-sectional view of an intermediate structure 200 with the high-k dielectric 210 that undergoes the reliability anneal according to embodiments. The IL 220 or oxide (e.g., $SiO_2$) dielectric is conformally formed by thermal or chemical oxidation of silicon nanosheets 110 as shown in the cross-sectional depiction. The IL 220 also conformally covers the surface of the nanosheets 110 visible in FIG. 2.

A conformal layer of high-k dielectric 210 is then deposited over the IL 220. The deposition may be via ALD, for example. The high-k dielectric 210 may be comprised of hafnium oxide ($HfO_2$), zirconium dioxide ($ZrO_2$), a silicon-doped zirconium oxide ($ZrSiO_x$), hafnium silicate ($HfSiO_x$), aluminum oxide ($Al_2O_3$), lanthanum oxide ($La_2O_3$), praseodymium oxide ($Pr_2O_3$), or another known material with a k value (thermal conductivity) above 10. The processes involved in performing the reliability anneal are detailed below according to three exemplary embodiments.

Figure 3:
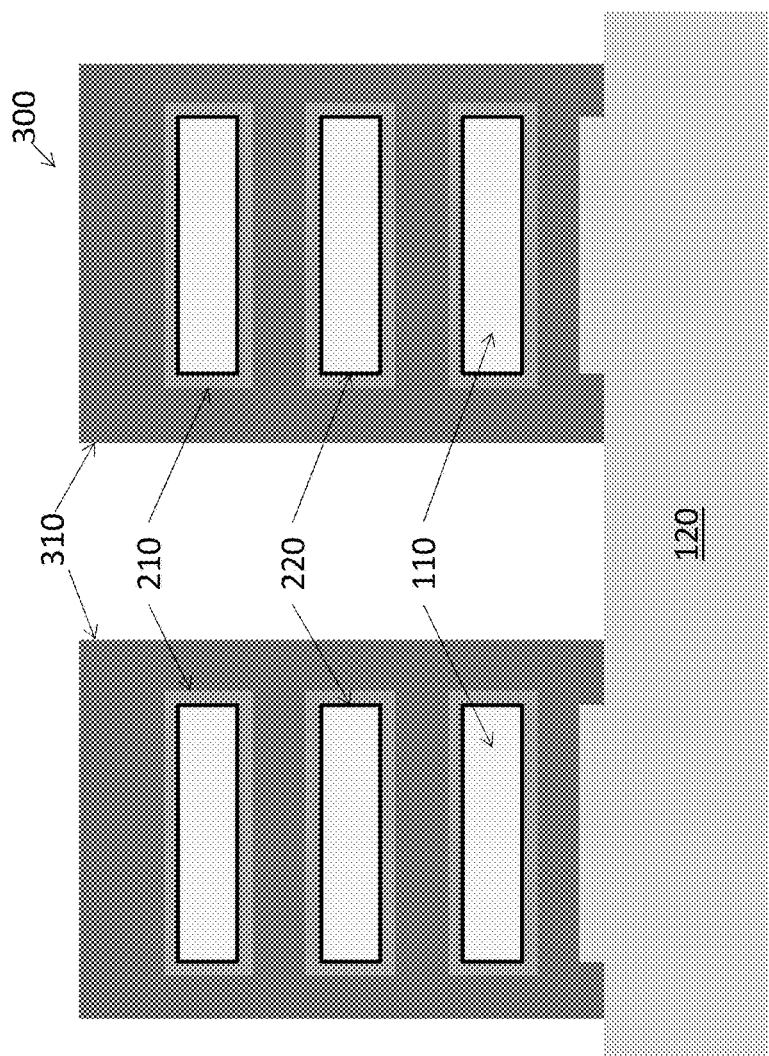
FIG. 3 shows a cross-sectional view of an intermediate structure that undergoes reliability anneal according to an embodiment.

FIG. 3 shows a cross-sectional view of an intermediate structure 300 that undergoes reliability anneal according to an embodiment. A thin conformal layer of SiN 310 is deposited over the high-k dielectric 210 stack. The deposition is via thermal ALD. As a result, the SiN 310 is deposited conformally in the empty spaces 115 (FIG. 2) as well as along the sides of the nanosheets 110, as FIG. 3 indicates.

The cross-sectional view of FIG. 3 does not show the surface of the nanosheets 110 visible in FIG. 1 (the cross-sections of which are visible in FIG. 3), but the IL 220, high-k dielectric 210, and SiN 310 also cover the surface of the nanosheets 110. Because the deposition via ALD of the SiN 310 ensures complete coverage of the empty spaces 115, as shown, the SiN 310 acts as a complete barrier to oxygen reaching the IL 220 below the high-k dielectric 210.

The reliability anneal itself is performed under conditions that are well-known. A spike rapid thermal process (referred to as spike anneal) or a soak rapid thermal process in the presence of a second process gas (referred to as soak anneal) may be performed at temperatures between 950 and 1200 degrees Celsius for two to five seconds, for example. As another example, a laser anneal at temperatures above 900 degrees may be performed. The purpose of the reliability anneal process is to densify and crystallize the high-k dielectric 210 (the high-k dielectric 410 is used to denote the post-anneal material in FIG. 4). The result is an improvement in negative-bias temperature instability (NBTI) or positive-bias temperature instability (PBTI), which are reliability issues in metal-oxide-semiconductor FETs (MOSFETs).

Figure 4:
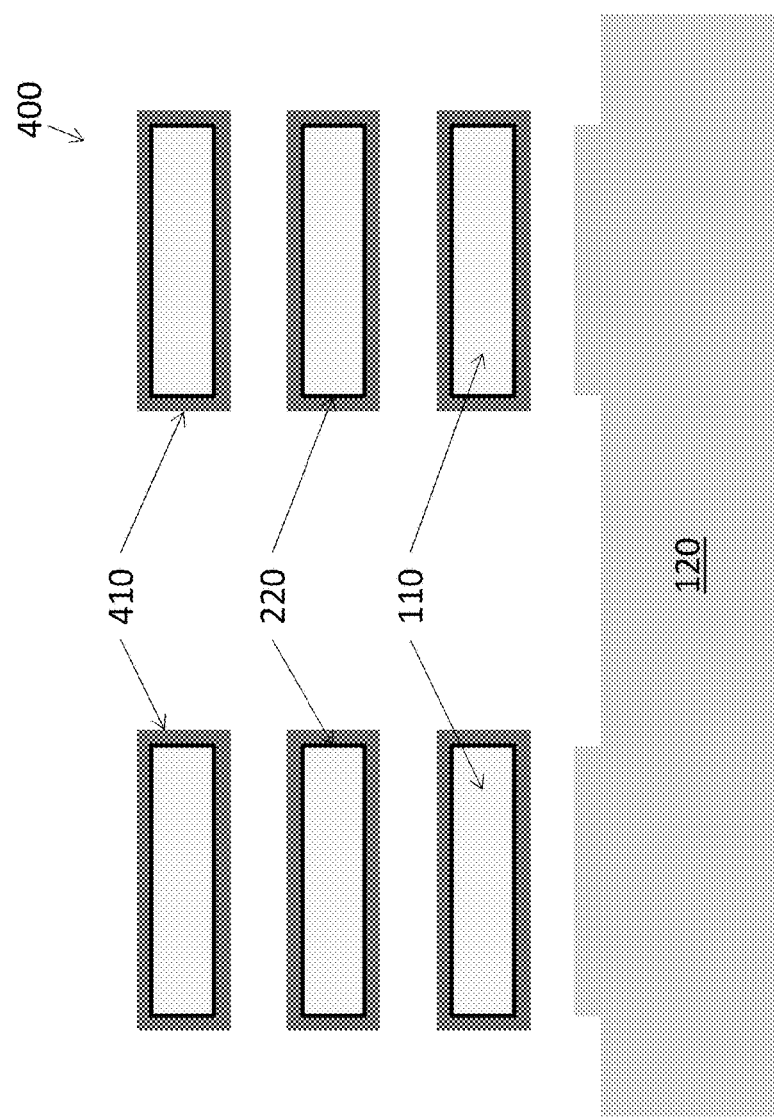
FIG. 4 shows the intermediate structure that results from selectively etching the SiN relative to the high-k dielectric that results from annealing according to embodiments.
Figure 5:
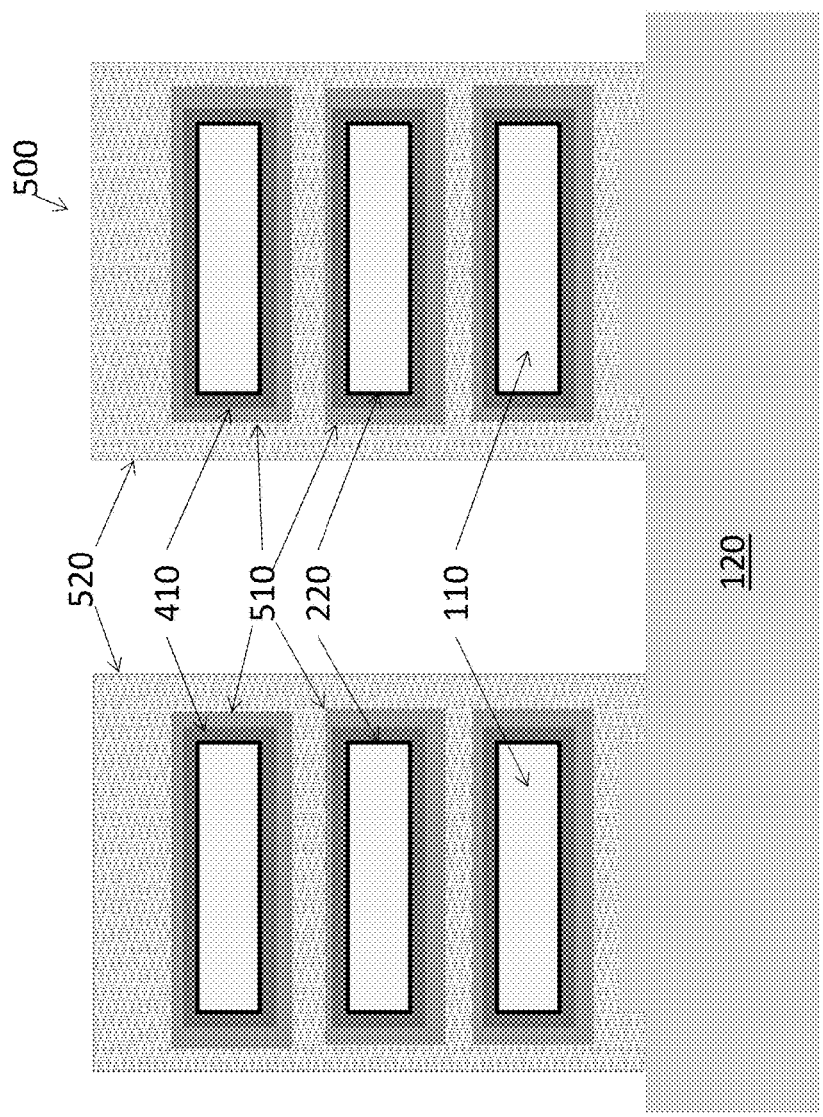
FIG. 5 shows a cross-sectional view of the intermediate structure resulting from depositions on the high-k dielectric resulting from the reliability anneal performed according to embodiments.

FIG. 4 shows the intermediate structure 400 that results from selectively etching the SiN 310 relative to the high-k dielectric 410 layer that results from annealing according to embodiments. The etchant may be a mixture of hydrofluoric acid and ethylene glycol, for example. The high-k dielectric 410 is a more reliable gate insulation layer following the reliability anneal process. The further processing of this intermediate structure 400 involves well-known steps. FIG. 5 shows the intermediate structure 500 resulting from some of those steps. FIG. 5 shows a cross-sectional view of the intermediate structure 500 resulting from depositions on the high-k dielectric 410 resulting from the reliability anneal performed according to embodiments. A workfunction metal 510 is conformally deposited which adjusts the work function (i.e., the minimum thermodynamic work needed to remove an electron) of the gate metal 520. The workfunction metal 510 may be a nitride such as titanium nitride (TiN) or tantalum nitride (TaN), or titanium carbide (TiC), titanium (Ti), aluminum (Al), $Al_2O_3$, or $La_2O_3$. The workfunction metal 510 may be deposited preferentially by the ALD methods. The gate metal 520 may be tungsten (W), cobalt (Co), or aluminum (Al), for example, and encapsulates the workfunction metal 510 and a set of nanosheets 110.

Figure 6:
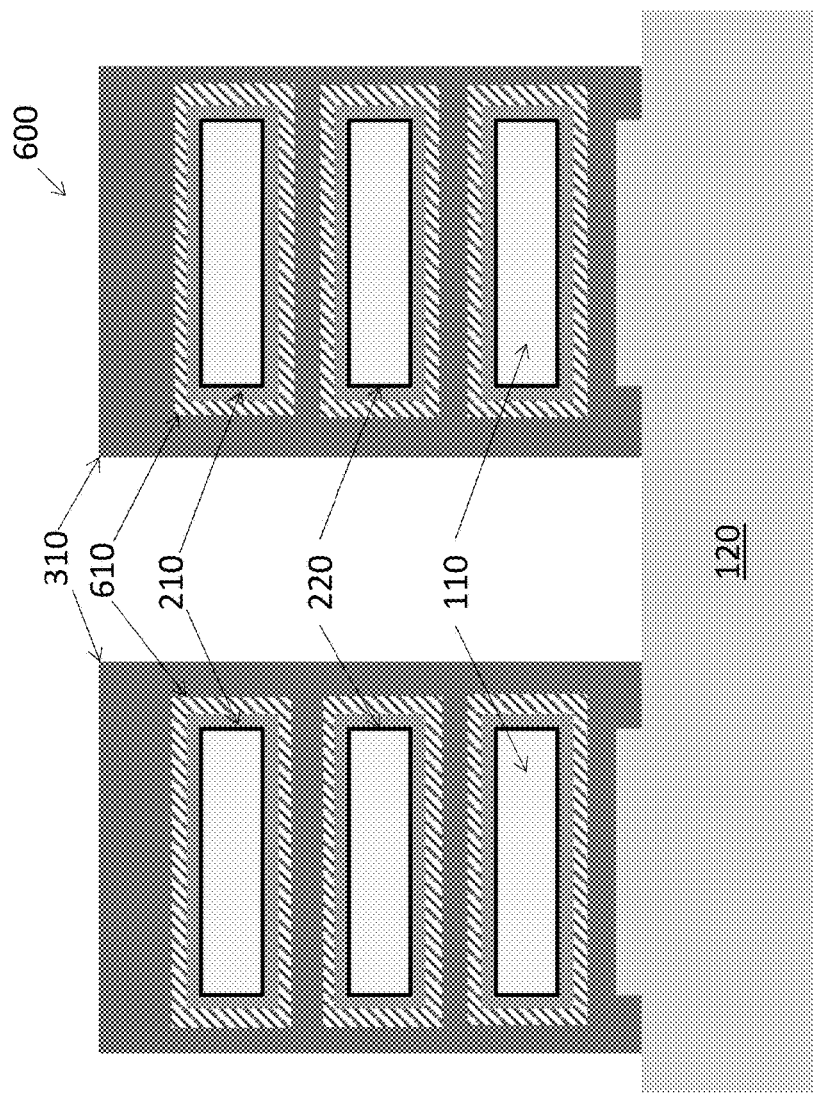
FIG. 6 shows a cross-sectional view of an intermediate structure that undergoes reliability anneal according to another embodiment.

FIG. 6 shows a cross-sectional view of an intermediate structure 600 that undergoes reliability anneal according to another embodiment. A thin conformal layer of TiN 610 is deposited on the high-k dielectric 210 in the intermediate structure 200 shown in FIG. 2. This is followed by deposition of SiN 310. The thickness of the SiN 310 layer may be 2 to 10 nanometers, for example. As noted with reference to FIG. 3, the SiN 310 covers the gaps or empty spaces 115 between adjacent nanosheets 110 and between a nanosheet 110 and the oxide layer 120. A reliability anneal process, which is generally described above and which is well-known, is performed on the intermediate structure shown in FIG. 6.

Figure 7:
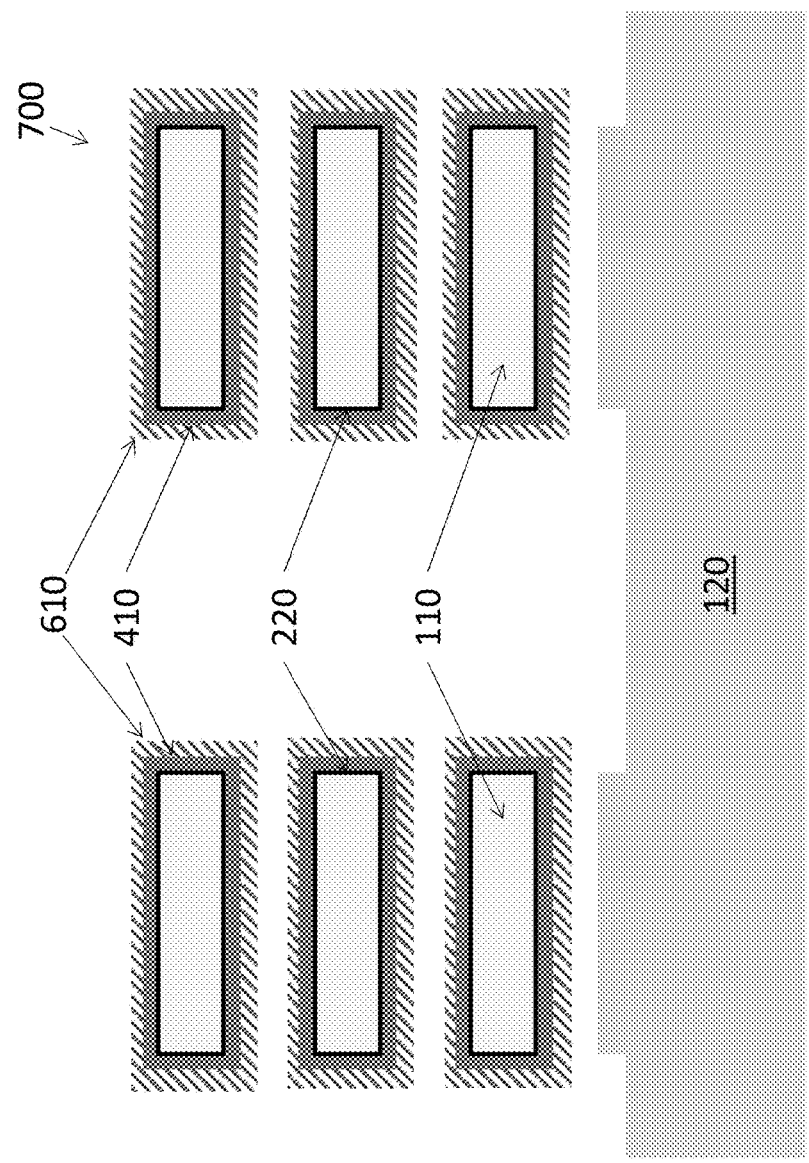
FIG. 7 shows a cross-sectional view of the intermediate structure that results from a selective etch on the intermediate structure following the reliability anneal according to the embodiment.

FIG. 7 shows a cross-sectional view of the intermediate structure 700 that results from a selective etch on the intermediate structure 600 following the reliability anneal according to the embodiment. The selective etch of SiN 310 relative to the TiN 610 that results in the intermediate structure 700 shown in FIG. 7 may include using a mixture of hydrofluoric acid and ethylene glycol as an etchant, for example. The TiN 610 may additionally protect the high-k dielectric 410 resulting from the reliability anneal during the selective etch to remove SiN 310.

Another selective etch is then performed on the intermediate structure 700 to obtain the intermediate structure 400 shown in FIG. 4. The second selective etch of TiN 610 relative to the high-k dielectric 410 may involve Huang A or Huang B, also known as a standard clean 1 (SC1) or standard clean 2 (SC2) bath. Huang A (SC1) is a mixture of ammonium hydroxide and peroxide in water and Huang B (SC2) is a mixture of hydrochloric axis (HCl) and hydrogen peroxide in water, for example. Once the intermediate structure 400 is obtained, deposition of the workfunction metal 510 and gate metal 520 (as discussed with reference to FIG. 5) and other known processes may be performed to obtain the gate-all-around FET.

Figure 8:
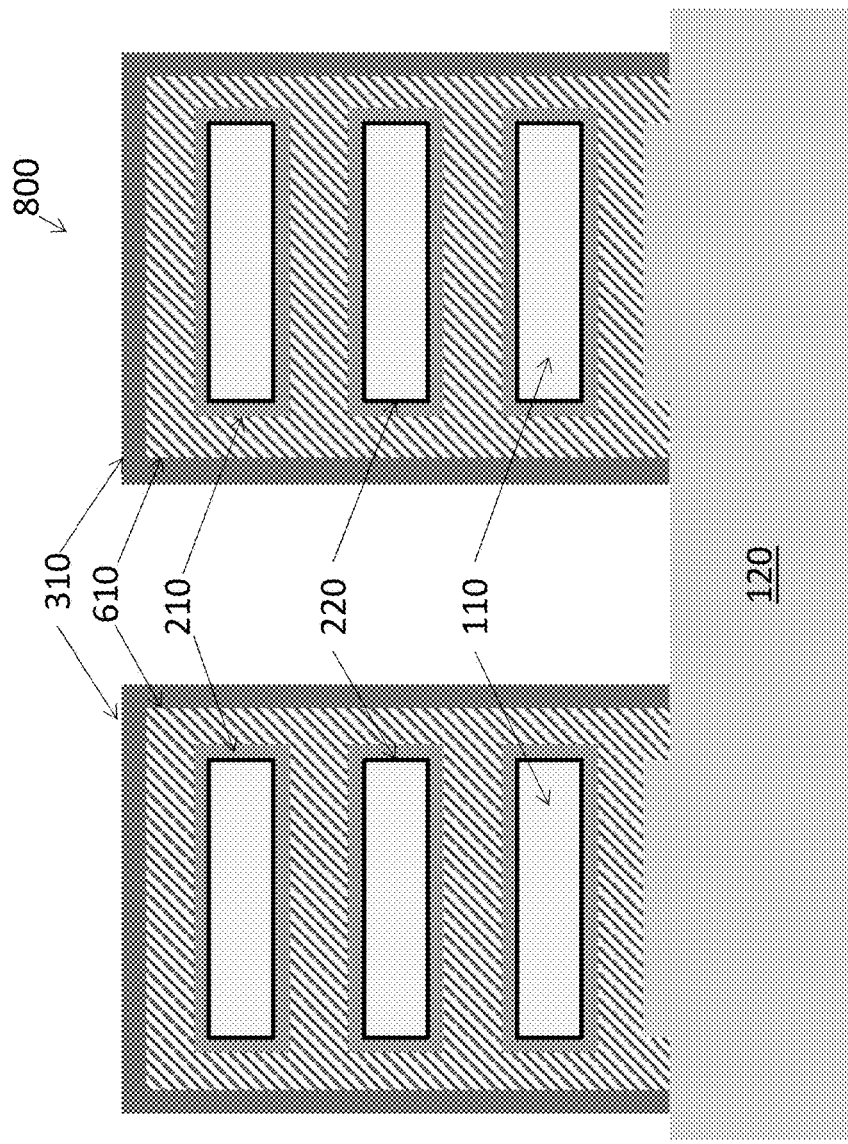
FIG. 8 shows a cross-sectional view of an intermediate structure that undergoes reliability anneal according to yet another embodiment.

FIG. 8 shows a cross-sectional view of an intermediate structure 800 that undergoes reliability anneal according to yet another embodiment. According to the present embodiment, the TiN 610 is deposited conformally in the empty spaces 115 between the nanosheets 110. The deposition of TiN 610 may be via ALD, for example. A thin conformal layer of SiN 310 is deposited over the TiN 610. The deposition of SiN 310 may be via ALD, as well, and may be to a thickness of 3 to 6 nanometers. The intermediate structure 800, like the intermediate structures 300 and 600 shown respectively in FIGS. 3 and 6, undergoes a reliability anneal process to increase the reliability of the high-k dielectric 210 as a gate insulation layer. The high-k dielectric 410 results from the reliability anneal. At this stage, processing steps similar to those discussed with reference to FIG. 7 are performed and are repeated here.

Figure 9:
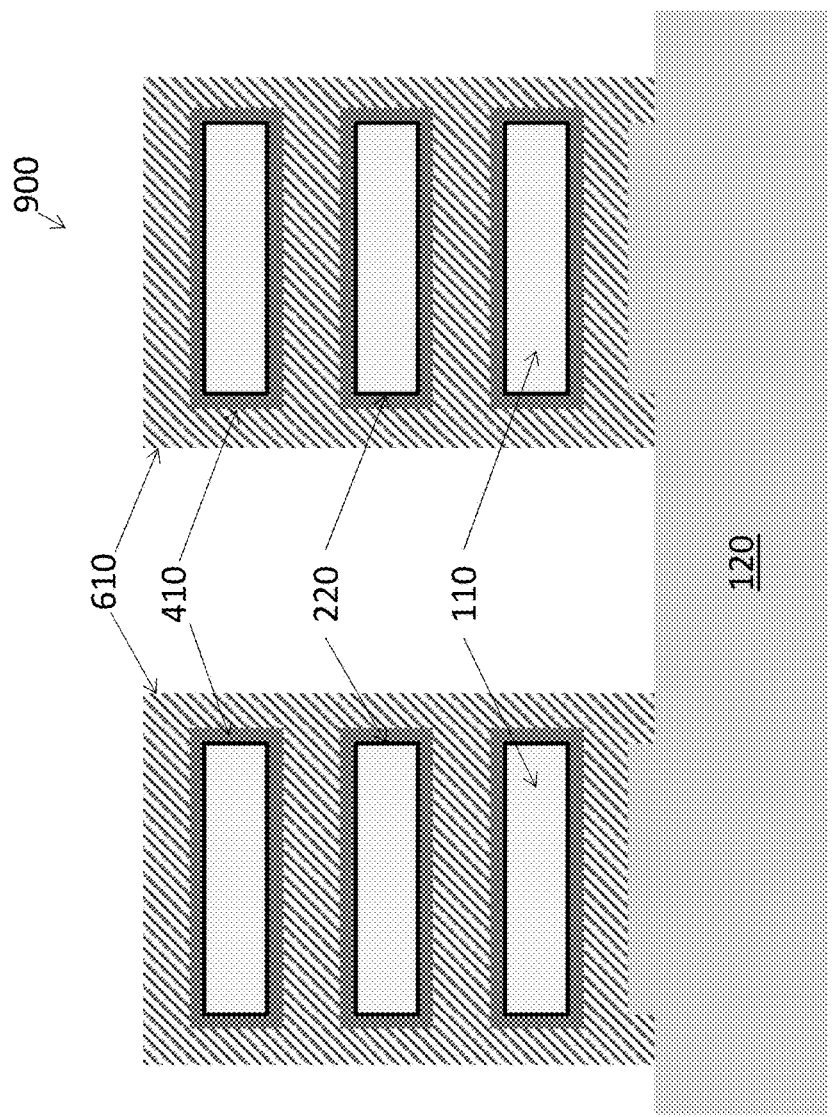
FIG. 9 shows a cross-sectional view of the intermediate structure that results from a selective etch on the intermediate structure following the reliability anneal according to the embodiment.

FIG. 9 shows a cross-sectional view of the intermediate structure 900 that results from a selective etch on the intermediate structure 800 following the reliability anneal according to the embodiment. The selective etch of SiN 310 relative to the TiN 610 that results in the intermediate structure 900 shown in FIG. 9 may include using a mixture of hydrofluoric acid and ethylene glycol as an etchant, for example. The TiN 610 may additionally protect the high-k dielectric 410 resulting from the reliability anneal during the selective etch to remove SiN 310. Another selective etch is then performed on the intermediate structure 900 to obtain the intermediate structure 400 shown in FIG. 4. The second selective etch of TiN 610 relative to the high-k dielectric 410 may involve a Huang A (SC1) or Huang B (SC2) bath. Huang A (SC1) is a mixture of ammonium hydroxide and hydrogen peroxide in water and Huang B (SC2) is a mixture of HCl and hydrogen peroxide in water, for example. Once the intermediate structure 400 is obtained, deposition of the workfunction metal 510 and gate metal 520 (as discussed with reference to FIG. 5) and other known processes may be performed to obtain the gate-all-around FET.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a gate-all-around field effect transistor (FET), the method comprising:
    forming a stack of silicon nanosheets above a substrate, the nanosheets being formed as three-dimensional structures with empty spaces around each of the nanosheets;
    forming an interfacial layer over the nanosheets, the forming the interfacial layer including covering four sides that form a perimeter of a cross-section of the three-dimensional structure of each of the nanosheets;
    depositing a high-k dielectric layer conformally on the interfacial layer;
    depositing a layer of silicon nitride (SiN) above the high-k dielectric layer;
    depositing titanium nitride (TiN) on the high-k dielectric layer and depositing the layer of SiN on the TiN, and performing reliability anneal after the depositing the layer of SiN to crystalize the high-k dielectric layer.

2. The method according to claim 1, wherein the covering the four sides that form the perimeter of the cross-section of the three-dimensional structure of each of the nanosheets includes partially filling the empty spaces.

3. The method according to claim 1, wherein the depositing the layer of SiN includes depositing SiN directly on the high-k dielectric layer.

4. The method according to claim 3, wherein the depositing the SiN is by atomic layer deposition and the SiN fills the empty spaces.

5. The method according to claim 1, wherein the depositing the TiN is by atomic layer deposition.

6. The method according to claim 5, wherein the depositing the TiN includes partially filling the empty spaces and leaving a remainder of the empty spaces.

7. The method according to claim 6, wherein the depositing the layer of SiN includes filling the remainder of the empty spaces.

8. The method according to claim 1, wherein the depositing the TiN includes completely filling the empty spaces.

9. The method according to claim 8, wherein the depositing the layer of SiN includes conformally depositing the layer of SiN over the TiN.

10. The method according to claim 1, further comprising selectively etching the layer of SiN following the reliability anneal.

11. The method according to claim 10, further comprising depositing a workfunction metal layer over the high-k dielectric layer.

12. The method according to claim 11, further comprising encapsulating the workfunction metal in a gate metal.

* * * * *